(12) United States Patent
Yang et al.

(10) Patent No.: US 7,611,963 B1
(45) Date of Patent: Nov. 3, 2009

(54) METHOD FOR FORMING A MULTI-LAYER SHALLOW TRENCH ISOLATION STRUCTURE IN A SEMICONDUCTOR DEVICE

(75) Inventors: Shu-Tine Yang, Jhubei (TW);
Chen-Hua Yu, Hsin-Chu (TW);
Chu-Yun Fu, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 12/111,355

(22) Filed: Apr. 29, 2008

(51) Int. Cl.
*H01L 21/301* (2006.01)
(52) U.S. Cl. .................. 438/426; 438/428; 438/427; 438/424; 438/E21.546
(58) Field of Classification Search ......... 438/424–428, 438/435–437
See application file for complete search history.

(56) References Cited

U.S. PATENT DOCUMENTS

| | | | |
|---|---|---|---|
| 6,465,325 B2 | 10/2002 | Ridley et al. | |
| 7,160,787 B2 * | 1/2007 | Heo et al. | 438/424 |
| 7,482,246 B2 * | 1/2009 | Eun | 438/437 |
| 2004/0192009 A1 * | 9/2004 | Belyansky et al. | 438/424 |
| 2004/0198019 A1 * | 10/2004 | Yasui et al. | 438/435 |
| 2009/0020845 A1 * | 1/2009 | Shin et al. | 257/506 |

* cited by examiner

*Primary Examiner*—Dung A. Le
(74) *Attorney, Agent, or Firm*—Haynes and Boone, LLP

(57) ABSTRACT

A method for forming a multi-layer shallow trench isolation structure in a semiconductor device is described. In one embodiment, the method includes etching a shallow trench in a silicon substrate of a semiconductor device and forming a dielectric liner layer on a floor and walls of the shallow trench. The method further includes forming a first doped oxide layer in the shallow trench, the first layer formed by vapor deposition of precursors including a source of silicon, a source of oxygen, and sources of doping materials at a first processing condition and forming a second doped oxide layer above the first doped oxide layer by vapor deposition using precursors of silicon and doping materials, at a second processing condition, different from the first processing condition.

8 Claims, 6 Drawing Sheets

METHOD FOR FORMING A MULTI-LAYER SHALLOW TRENCH ISOLATION STRUCTURE IN A SEMICONDUCTOR DEVICE

BACKGROUND

The present disclosure relates generally to the field of shallow trench isolation structures in semiconductor substrates of integrated circuits, and, more specifically, to the field of multilayer shallow trench isolation structures in semiconductor substrates.

In very large scale integrated circuits (VLSIs), huge numbers of discrete electronic devices are present on a semiconductor substrate. Since all electronic devices are becoming miniaturized, the space between the devices is getting narrower. Due to this, isolation of the devices from each other is becoming increasingly difficult. It is common to etch shallow trenches in silicon substrates to achieve isolation of discrete electronic devices in VLSIs However, the shallow trench isolation structures used in the art have some disadvantages. For example, voids are formed in the dielectric materials used to fill the shallow trench. Such voids formed in the dielectric materials adversely affect isolation of the devices which affects the overall structural integrity of the integrated circuits.

Accordingly, it would be desirable to provide an improved process for preparation of shallow trench isolation structures. In particular, the method should overcome the problem of void formation and provide effective device isolation.

BRIEF DESCRIPTION OF THE DRAWINGS

FIG. 1 shows a schematic cross-section of the silicon substrate, having a pad oxide layer and a pad silicon nitride layer deposited above the silicon substrate.

FIG. 2 shows a schematic cross-section of the silicon substrate having an etched shallow trench.

FIG. 3 shows formation of an oxide layer above a floor and sidewalls of the shallow trench.

FIG. 4 shows formation of a silicon nitride layer above the oxide layer.

FIG. 5 shows deposition of the first doped oxide layer in the shallow trench without overhang formation at the top corner of the trench.

FIG. 6 shows elimination of seams or voids, if present, in the first doped oxide layer by using a high temperature annealing process.

FIG. 7 shows deposition of a second doped oxide layer above the first doped oxide layer in the shallow trench without overhang formation at the top corner of the trench.

FIG. 8 shows elimination of seams or voids, if present, in the second doped oxide layer by using a high temperature annealing process.

FIG. 9 shows deposition of a cap oxide layer, above the second doped oxide layer, to completely fill the shallow trench.

FIG. 10 shows removal of cap oxide above the silicon substrate by a chemical mechanical polishing (CMP) process, leveling the shallow trench with the surrounding silicon substrate.

FIGS. 1-6 and 11-12 together illustrate a second embodiment of the invention, showing the steps for formation of a shallow trench isolation structure having a first doped oxide layer, a silicon oxide layer formed by atomic layer deposition, and a cap oxide layer.

The steps shown in FIGS. 1-6 are the same for the first and second embodiments of the invention.

Figure 11:
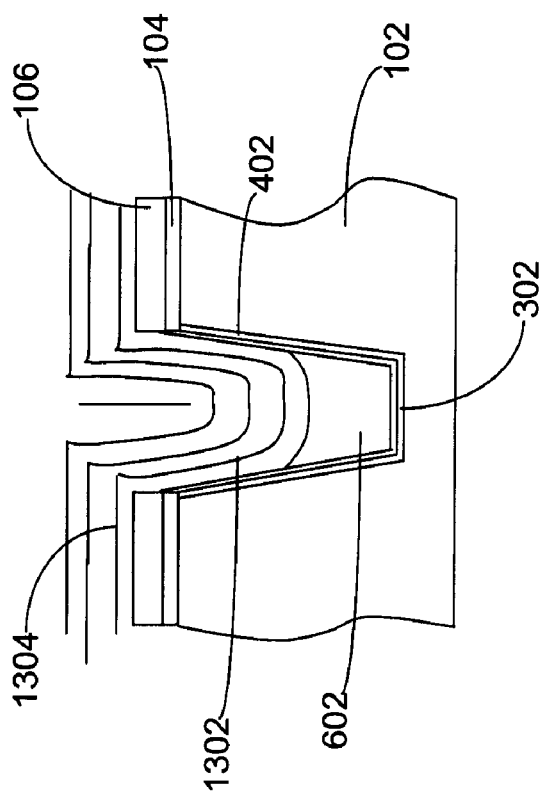

FIG. 11 shows deposition of a silicon oxide layer above the first doped oxide layer by atomic layer deposition (ALD).

Figure 12:
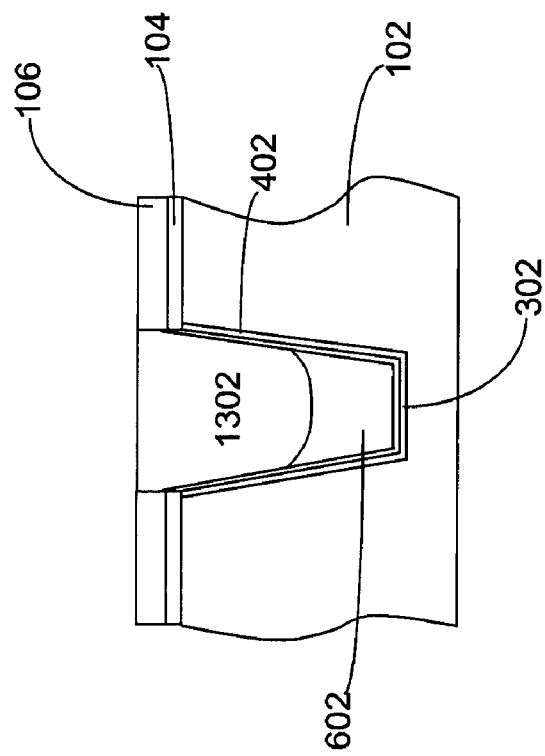

FIG. 12 shows removal of the silicon oxide above the silicon substrate by a chemical mechanical polishing (CMP) process, leveling the shallow trench with the surrounding silicon substrate.

DETAILED DESCRIPTION OF THE PREFERRED EMBODIMENTS

Aspects of the present disclosure are best understood from the following detailed description when read with the accompanying figures. It is emphasized that, in accordance with the standard practice in the industry, various features are not drawn to scale. In fact, the dimensions of the various features may have been arbitrarily increased or reduced for clarity of discussion. In addition, the present disclosure may repeat reference numerals and/or letters in the various examples. This repetition is for simplicity and clarity and does not in itself indicate a relationship between the various embodiments discussed.

The following disclosure provides many different embodiments, or examples, for implementing different features of the invention. These are, of course, merely examples and are not intended to limit the full scope of the invention.

FIGS. 1-10 illustrate a first embodiment of the invention, showing steps for the formation of a shallow trench isolation structure in a semiconductor substrate (for example, silicon substrate). In this embodiment, the trench is filled with a first doped oxide layer, a second doped oxide layer, and a cap oxide layer. The steps in the process of making this embodiment of the shallow trench isolation structure are described in detail in the following paragraphs.

Figure 1:
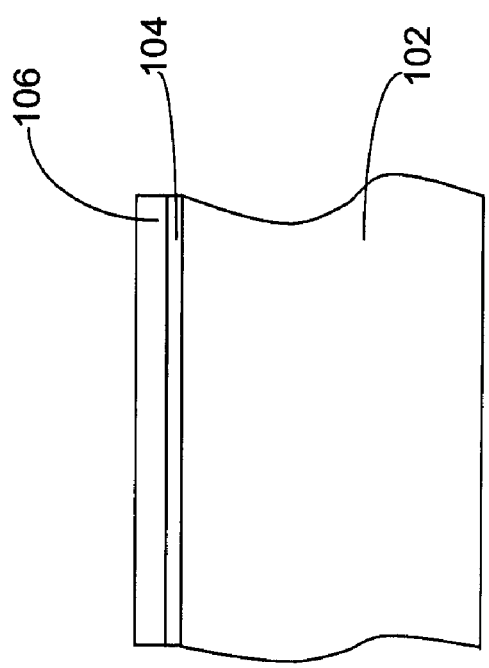

A schematic cross-section of a silicon substrate 102 is shown in FIG. 1. A pad oxide layer 104 and a pad silicon nitride layer 106 may be present on the surface of the silicon substrate 102, as shown in FIG. 1. The pad silicon nitride layer 106 acts as a stop layer for chemical mechanical polishing (CMP).

Figure 2:
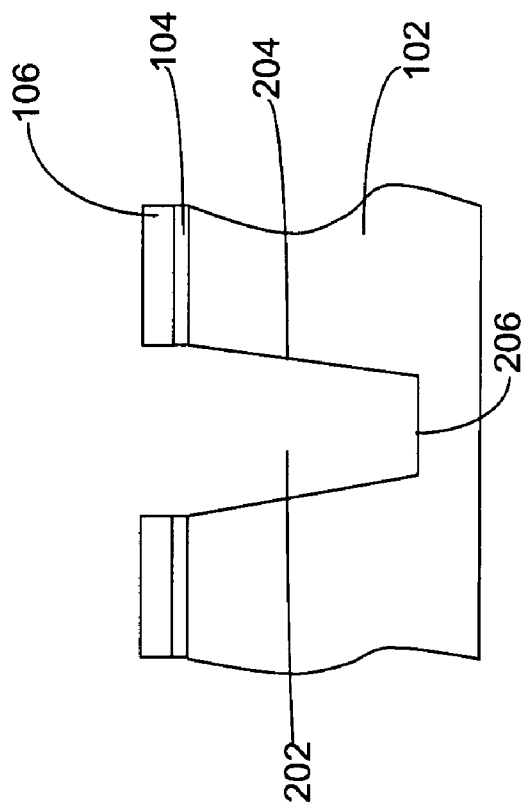
FIGS. 1-10 illustrate a first embodiment of the invention, showing steps for the formation of a shallow trench isolation structure in a silicon substrate. The trench is filled with a first doped oxide layer, a second doped oxide layer, and a cap oxide layer.

As shown in FIG. 2, a shallow trench 202 may be etched through the nitride layer 106 and the oxide layer 104 into the substrate 102 by a dry etch method. The shallow trench 202 may also be formed by other methods known in the art.

Figure 3:
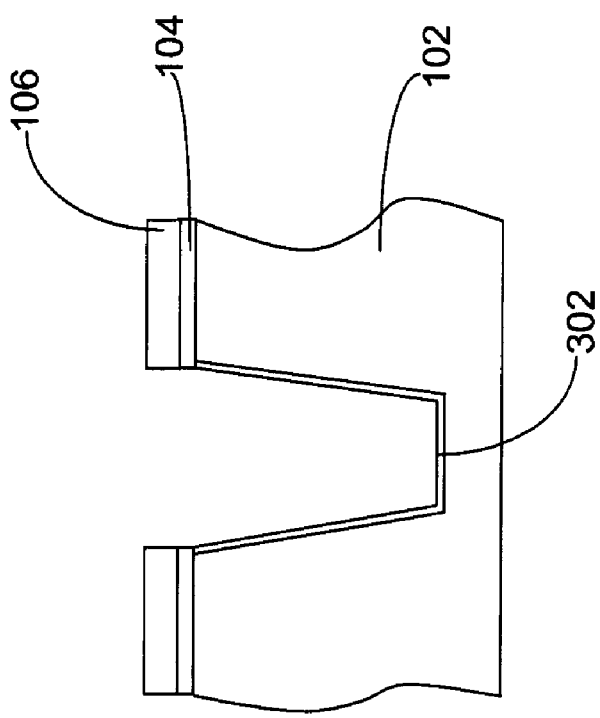

Another step in the embodiment involves formation of an oxide layer 302 on the floor and sidewalls of the shallow trench, as shown in FIG. 3. Formation of the oxide layer 302 may be carried out by an in-situ steam generation (ISSG) process, a thermal process, etc. There may also be annealing of the oxide layer 302.

Figure 4:
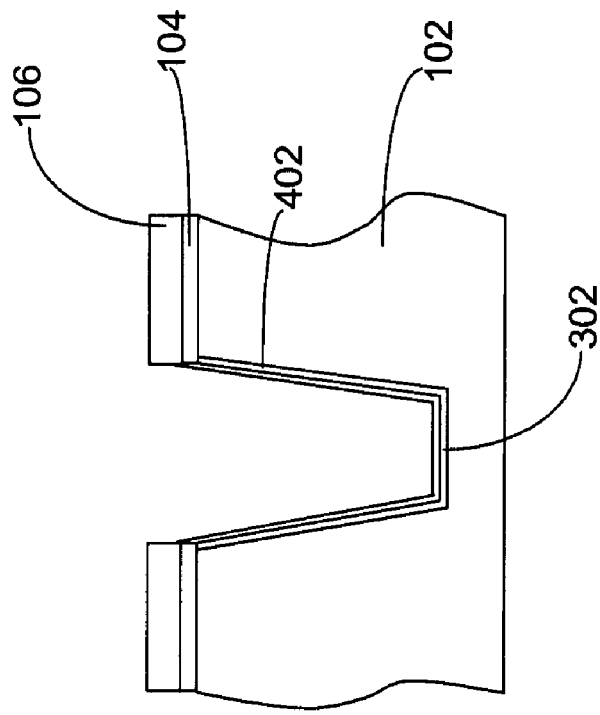

Another step in this embodiment involves deposition of a silicon nitride layer 402 above the oxide layer 302 as shown in FIG. 4. Formation of the silicon nitride layer 402 may be achieved by nitridation of the oxide layer 302 or a portion of the oxide layer using a variety of methods, for example, plasma treatment, thermal treatment, etc., and using a variety of nitrogen precursors, for example, ammonia ($NH_3$), nitrogen ($N_2$), nitrous oxide ($N_2O$), etc. Plasma treatment may involve use of plasma enhanced chemical vapor deposition (PECVD) treatment, decoupled plasma nitridation (DPN), etc. Thermal treatment may involve use of furnace, rapid thermal process (RTP), etc. Formation of the silicon nitride layer 402 may also be achieved by deposition of silicon nitride using a furnace, a PECVD method, etc. Liner oxide nitridation or additional liner SiN deposition can be used to prevent Boron & Phosphorus of BPSG from out-diffusing to substrate silicon during the subsequent re-flow process and other thermal processes.

Figure 5:
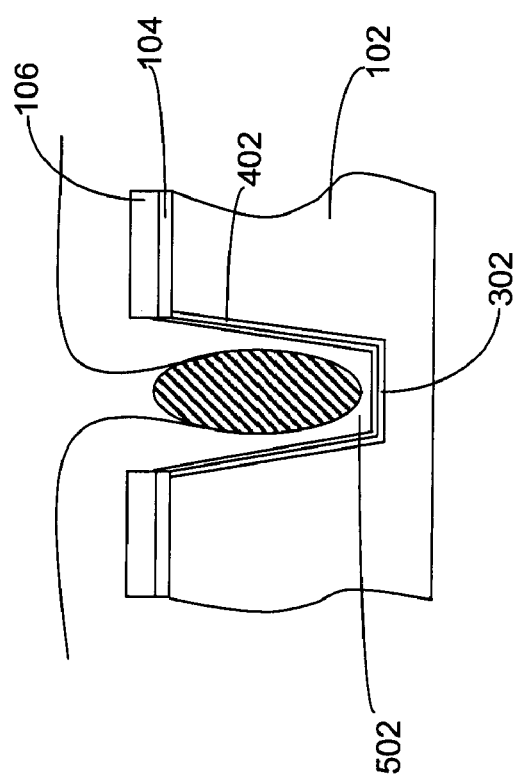

FIG. 5 shows another step in this embodiment. This step involves deposition of a first doped oxide layer 502 in the shallow trench 202 under a set of processing conditions that may collectively be called a first processing condition. Deposition of the first doped oxide layer 502 may involve use of precursors of silicon oxide, for example, silane (SiH4), tetraethylorthosilicate (TEOS), etc. as a source for the silicon oxide component. The doping components in the first doped oxide layer may be boron, phosphorous, etc. The first processing condition includes within its definition, among other things, concentrations of the doping materials like boron, phosphorous, etc, and the temperature and pressure at which the deposition of the first oxide layer occurs. In a preferred embodiment, boron concentration may be in a range between approximately 4 and 8 weight percentage, phosphorous concentration in a range between approximately 3 and 6 weight percentage, and the aggregate of boron and phosphorous concentration less than 10.0 weight percentage. Boron may be deposited using precursors, for example, diborane (B2H6), triethylborane (TEB), etc. Phosphorous may be deposited using precursors, for example, phosphorus hydride (PH3), triethylphosphate (TEPO), etc. The first processing condition further includes a temperature in a range between about 300 and 600° C. and a pressure in a range between about 100 and 300 torr. Deposition of the first doped oxide layer 502 may be carried out using sub-atmospheric pressure chemical vapor deposition (SACVD), PECVD, etc. under specified conditions, for example, the first processing condition. Low deposition rate with higher boron concentration of the first doped oxide layer can avoid overhang formation at trench top corners.

Figure 6:
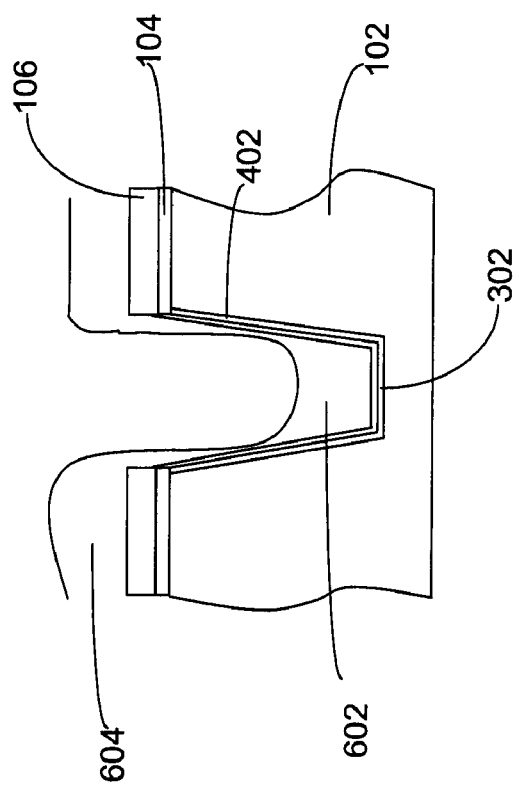

During the process of deposition of the first doped oxide layer in the shallow trench, seams or voids may be created in the first doped oxide layer. Any voids or seams formed during the initial deposition of the first doped oxide layer may be removed by a thermal annealing (re-flow) process as shown in FIG. 6. A high temperature annealing process may be performed at a temperature in a range between about 800 and 1200° C. and in an ambient atmosphere that may include oxygen, nitrogen, air, etc. using a rapid thermal annealing (RTA) method, a furnace method, etc. The high temperature annealing procedure results in reflowing of the first doped oxide layer 502, due to which seams or voids, if present, are eliminated and a void-free first doped oxide layer 602 is formed as shown in FIG. 6.

Figure 7:
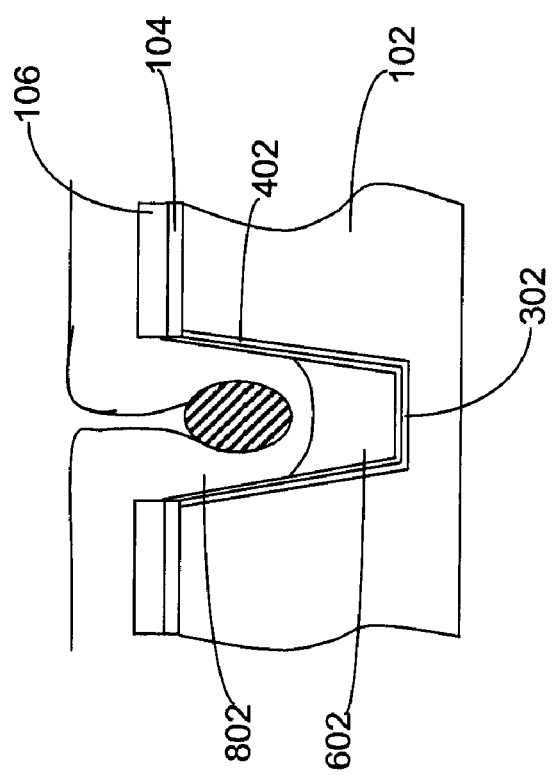

FIG. 7 shows another step in this embodiment that involves deposition of a second doped oxide layer 802 in the shallow trench 202 under a set of processing conditions that may collectively be called a second processing condition. Deposition of the second doped oxide layer 802 may also involve use of precursors of silicon oxide, for example, silane (SiH4), tetraethylorthosilicate (TEOS), etc. as a source for the silicon oxide component. The doping components in the second doped oxide layer may be boron, phosphorous, etc. The first processing condition includes within its definition, among other things, concentrations of the doping materials like boron, phosphorous, etc, and the temperature and pressure at which the deposition of the first oxide layer occurs. The boron concentration may preferably be in a range between approximately 4 and 6 weight percentage, phosphorous concentration may preferably be in a range between approximately 4 and 6 weight percentage, and the aggregate of boron and phosphorous concentration may preferably be less than 10.0 weight percentage. Boron may be deposited using precursors, for example, diborane (B2H6), triethylborane (TEB), etc. Phosphorous may be deposited using precursors, for example, phosphorus hydride (PH3), triethylphosphate (TEPO), etc. The temperature may preferably be in a range between about 300 and 600° C. and the pressure may preferably be in a range between about 100 and 300 torr. Deposition of the second doped oxide layer 802 may be carried out using sub-atmospheric pressure chemical vapor deposition (SACVD), PECVD, etc. under specified conditions, for example, the first processing condition. Deposition of the second doped oxide layer 802 may employ high deposition rate with lower boron concentration than that of the first doped oxide layer. The second doped oxide layer deposition may be done in such a way that overhang formation at trench top corners can be avoided. The second BPSG deposition can use higher deposition rate with lower Boron concentration than that of the first BPSG deposition for the consistence of throughput and gapfill.

Figure 8:
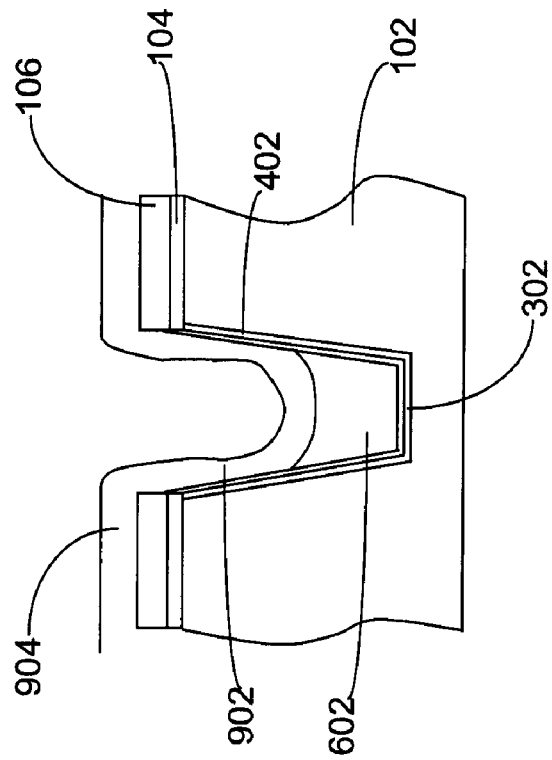

During the process of deposition of the second doped oxide layer in the shallow trench, a seam or void can be created in the second doped oxide layer. Any voids or seams formed during the initial deposition of the second doped oxide layer may be removed by a thermal annealing (re-flow) process as shown in FIG. 8. A high temperature annealing process may be performed at a temperature in a range between about 600 and 1200° C. and in an ambient atmosphere that may include oxygen, nitrogen, air, etc. using a rapid thermal annealing (RTA) method, a furnace method, etc. The high temperature annealing procedure results in reflowing of the second doped oxide layer 802, due to which seams or voids, if present, are eliminated and a void-free second doped oxide layer 902 is formed. One distinguishing feature of this embodiment is that the first processing condition for deposition of the first doped oxide layer may be different from the second processing condition for deposition of the second doped oxide layer. Similarly, the annealing conditions for the first and second doped oxide layers may be different from each other.

In a preferred embodiment, the thickness ratio between the first void-free doped oxide layer 602 and the second void-free doped oxide layer 902 may vary in a range between about 0.1 and 1.

Figure 9:
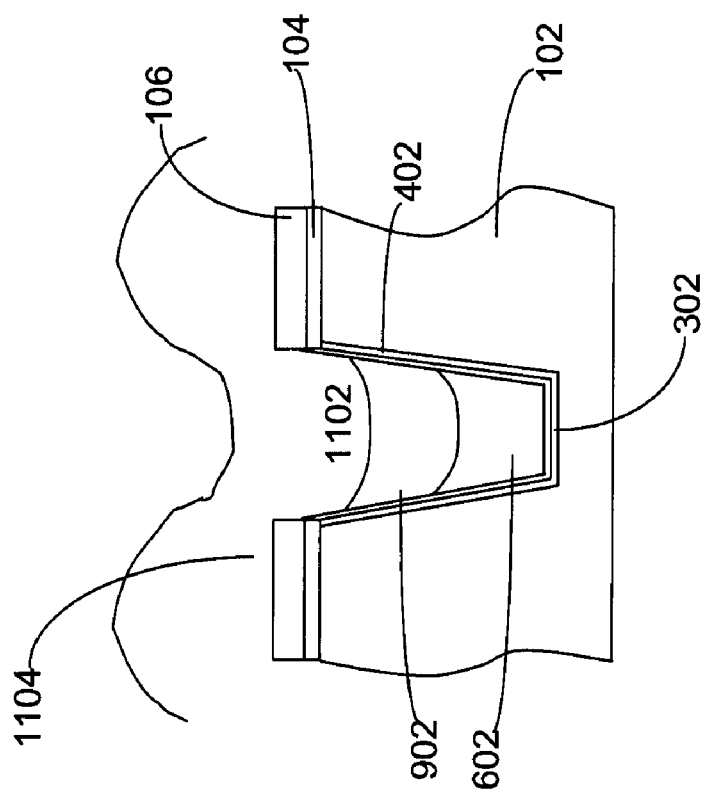

FIG. 9 shows another step in this embodiment that involves deposition of a cap oxide layer 1102 to fill the remaining portion of the shallow trench 202. Deposition of the cap oxide layer 1102 may be carried out using a variety of methods, including for example, sub-atmospheric pressure chemical vapor deposition (SACVD), high-density plasma CVD of undoped silicon glass (HDP-USG), plasma enhanced silicon oxide (PEOX), etc. The cap oxide layer 1102 can serve as a diffusion barrier to prevent out-diffusion of boron and phosphorus from the doped oxide layers to top devices during the subsequent re-flow and other thermal processes. In addition, the cap oxide layer 1102 can also protect the doped oxide layers from being wet etched during the subsequent wet dip steps.

Figure 10:
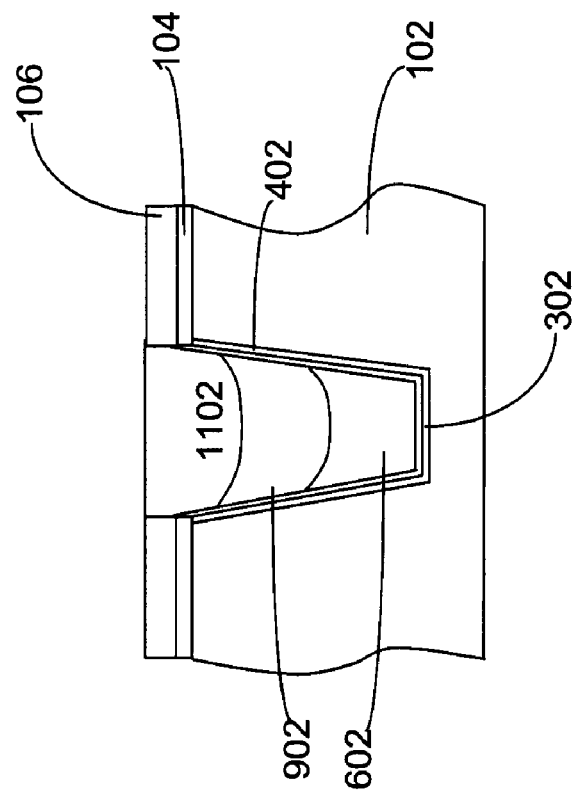

Another step in this embodiment involves removal of the cap oxide film and/or the doped oxide layers above the pad silicon nitride layer 106 by using CMP, leveling the shallow trench 202 with the surrounding silicon substrate, as shown in FIG. 10.

FIGS. 1-6 and FIGS. 11-12 together illustrate a second embodiment of the invention, showing steps for the formation of a shallow trench isolation structure having a first doped oxide layer and a second silicon oxide layer deposited by atomic layer deposition. The steps in the process of making the second embodiment of the shallow trench isolation structure are described in detail in the following paragraphs.

A schematic cross-section of a silicon substrate 102 is shown in FIG. 1. A pad oxide layer 104 and a pad silicon nitride layer 106 may be present on the surface of the silicon substrate 102, as shown in FIG. 1. The pad silicon nitride layer 106 acts as a stop layer for chemical mechanical polishing (CMP).

As shown in FIG. 2, a shallow trench 202 may be etched through the nitride layer 106 and the oxide layer 104 into the substrate 102 by a dry etch method. The shallow trench 202 may also be formed by other methods well known in the art.

Another step in the method of the embodiment involves formation of an oxide layer 302 the floor and sidewalls of the shallow trench, as shown in FIG. 3. In a preferred embodiment, formation of the oxide layer 302 may be carried out bay a variety of methods, for example, an in-situ steam generation (ISSG) process, a thermal process, etc. The preferred embodiment may further comprise annealing of the oxide layer 302.

FIG. 4 shows another step in this embodiment that involves deposition of a silicon nitride layer 402 above the oxide layer 302. Formation of the silicon nitride layer 402 may be achieved by nitridation of the oxide layer 302 using a variety of methods, for example, plasma treatment, thermal treatment, etc., and using a variety of nitrogen precursors, for example, ammonia (NH3), nitrogen (N2), nitrous oxide (N2O), etc. Plasma treatment may involve use of plasma enhanced chemical vapor deposition (PECVD) treatment, decoupled plasma nitridation (DPN), etc. Thermal treatment may involve use of furnace, rapid thermal process (RTP), etc. Formation of the silicon nitride layer 402 may also be achieved by deposition of silicon nitride using a furnace, a PECVD method, etc. Liner oxide nitridation or additional liner SiN deposition is used to prevent Boron & Phosphorus of BPSG from out-diffusing to substrate silicon during the subsequent re-flow process and other thermal processes.

FIG. 5 shows another step in this embodiment. This step involves deposition of a first doped oxide layer 502 in the shallow trench 202 under a set of processing conditions that may collectively be called a first processing condition. Deposition of the first doped oxide layer 502 may involve use of precursors of silicon oxide, for example, silane (SiH4), tetraethylorthosilicate (TEOS), etc. as a source for the silicon oxide component. The doping components in the first doped oxide layer may be boron, phosphorous, etc. The first processing condition includes within its definition, among other things, having boron concentration in a range between approximately 4 and 8 weight percent, phosphorous concentration in a range between approximately 3 and 6 weight percent, and the aggregate of boron and phosphorous concentrations less than 10.0 weight percent. Boron may be deposited using a variety of precursors, for example, diborane (B2H6), triethylborane (TEB), etc. Phosphorous may be deposited using precursors, for example, phosphorus hydride (PH3), triethylphosphate (TEPO), etc. Low deposition rate with higher boron concentration of the first doped oxide layer can avoid overhang formation at trench top corners. The first processing condition further includes a temperature in a range between about 300 and 600° C. and a pressure in a range between about 100 and 300 torr. Deposition of the first doped oxide layer 502 may be carried out using sub-atmospheric pressure chemical vapor deposition (SACVD), PECVD, etc.

Seams or voids may be created during the process of deposition of the first doped oxide layer 502 in the shallow trench. Any voids or seams formed during the initial deposition of the first doped oxide layer 502 may be removed by a thermal annealing (re-flow) process as shown in FIG. 6. A high temperature annealing process may be performed at a temperature in a range between about 800 and 1200° C. and an ambient atmosphere including oxygen, nitrogen or air, using a rapid thermal annealing (RTA), a furnace method, etc. The high temperature annealing procedure results in reflowing of the first doped oxide layer 502, due to which seams or voids, if present, are eliminated and a void-free first doped oxide layer 602 is formed.

FIG. 11 shows another step of the embodiment that involves deposition of a silicon oxide layer 1302 above the first doped oxide layer 602 by using atomic layer deposition (ALD). Various oxide layers formed above the pad nitride layer 106 may be removed by CMP, leveling the shallow trench with the surrounding substrate, as shown in FIG. 12.

In an embodiment, the thickness ratio between the doped oxide layer 602 and the silicon oxide layer 1302 may be in a range between about 0.1 and 1.

Features of several embodiments have been outline above. Those skilled in the art will appreciate that they may readily use the present disclosure as a basis for designing or modifying other processes and structures for carrying out the same purposes and/or achieving the same advantages as the embodiments introduced above. In one example, the doped oxide filled in the shallow trench includes more than two doped oxide layers each with different doping concentrations. In furtherance of the example, the doping concentration and other deposition conditions may continuously shift such that a graded doped oxide layer is filled in the shallow trench. In another example, the liner layer including the oxide layer 302 and silicon nitride layer 402 lining the shallow trench may alternatively include a silicon oxide layer, a silicon nitride layer, a silicon oxynitride layer, and/or various combinations thereof. In other examples, additional processing steps, such as annealing and CMP may present in various embodiments of the present disclosure to optimize the gap filling of the shallow trench. Those skilled in the art will also realize that such equivalent constructions do not depart from the spirit and scope of the present disclosure, and that they may make various changes, substitutions and alterations to the disclosed embodiments without departing from the spirit and scope of the present disclosure.

The invention claimed is:

1. A method for forming a multi-layer shallow trench isolation structure in a semiconductor device, the method comprising the steps of:
   etching a shallow trench in a silicon substrate of a semiconductor device;
   forming a dielectric liner layer on a floor and walls of the shallow trench;
   forming a first doped oxide layer in the shallow trench, the first layer formed by vapor deposition of precursors including a source of silicon, a source of oxygen, and sources of doping materials at a first processing condition; and
   forming a second doped oxide layer above and in direct contact with the first doped oxide layer by vapor deposition using precursors of silicon and doping materials, at a second processing condition, different from the first processing condition; wherein
   the doping materials in the first doped oxide layer comprise boron and phosphorus; and
   the first processing condition comprises boron concentration in the range of approximately 4-8 wt %, phosphorus concentration in the range of approximately 3-6 wt %.

2. The method of claim 1, wherein:
the dielectric liner layer comprises a silicon oxide layer and a Nitrogen containing layer.

3. The method of claim 1, wherein:
the doping materials in the second doped oxide layer are boron and phosphorus;
the second processing condition comprises boron concentration in the range of approximately 4-6 wt %, phosphorus concentration in the range of approximately 4-6 wt %.

4. The method of claim 1, further comprising depositing a cap oxide layer above the second doped oxide layer, keeping a thickness ratio between the second doped oxide layer and the cap oxide layer in the range of approximately 1 to 6.

5. The method of claim 1, wherein a thickness ratio between the first doped oxide layer and the second doped oxide layer is in the range of approximately 0.1 to 1.

6. A method for forming a multi-layer shallow trench isolation structure in a semiconductor device, the method comprising the steps of:
etching a shallow trench in a silicon substrate of a semiconductor device;
forming a dielectric liner layer on a floor and walls of the shallow trench;
forming a doped oxide layer above the dielectric liner layer by vapor deposition using precursors of silicon and doping materials; and
forming a silicon oxide layer above the doped oxide layer by atomic layer deposition;
wherein:
a thickness ratio of the doped oxide layer to the silicon oxide layer is in the range of approximately 0.1 to 1;
the doping materials in the first doped oxide layer comprise boron and phosphorus; and
doping components of the doped oxide layer comprise boron concentration in the range of approximately 4-8 wt %, phosphorus concentration in the range of approximately 3-6 wt %.

7. The method of claim 6, wherein:
the dielectric liner layer comprises a silicon oxide layer and a Nitrogen containing layer.

8. The method of claim 6, further comprising depositing a cap oxide layer above the silicon oxide layer, keeping a thickness ratio between the silicon oxide layer and the cap oxide layer in the range of approximately 1 to 6.

* * * * *